United States Patent
Chu et al.

(10) Patent No.: US 8,021,954 B2
(45) Date of Patent: Sep. 20, 2011

(54) INTEGRATED CIRCUIT SYSTEM WITH HIERARCHICAL CAPACITOR AND METHOD OF MANUFACTURE THEREOF

(75) Inventors: Shao-fu Sanford Chu, Singapore (SG); Shaoqing Zhang, Singapore (SG); Johnny Kok Wai Chew, Singpore (SG); Chit Hwei Ng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 298 days.

(21) Appl. No.: 12/471,007

(22) Filed: May 22, 2009

(65) Prior Publication Data
US 2010/0295153 A1    Nov. 25, 2010

(51) Int. Cl.
H01L 21/20    (2006.01)
H01L 21/02    (2006.01)
(52) U.S. Cl. .................... 438/396; 257/532
(58) Field of Classification Search .......... 438/396; 257/532, E29.342, E21.008
See application file for complete search history.

(56) References Cited

U.S. PATENT DOCUMENTS

| | | | |
|---|---|---|---|
| 6,819,542 B2 | 11/2004 | Tsai et al. | |
| 6,897,505 B2 | 5/2005 | Aton | |
| 2007/0123015 A1 | 5/2007 | Chinthakindi et al. | |
| 2008/0099880 A1 | 5/2008 | Cho et al. | |
| 2010/0295153 A1* | 11/2010 | Chu et al. | 257/532 |

OTHER PUBLICATIONS

Daeik Kim, Jonghae Kim, Jean-Olivier Plouchart, Choongyeun Cho, Robert Trzcinski, Mahender Kumar, and Christine Norris, Symmetric Vertical Parallel Plate Capacitors for On-Chip RF Circuits in 65-nm SOI Technology, IEEE Electron Device Letters, vol. 28, No. 7, Jul. 2007.

Jonghae Kim, Jean-Olivier Plouchart, Noah Zamdmer, Melanie Sherony, Liang-Hung Lu, Yue Tan, Meeyoung Yoon, Keith A. Jenkins, Mahender Kumar, Asit Ray, and Lawrence Wagner, 3-Dimensional Vertical Parallel Plate Capacitors in an SOI CMOS Technology for Integrated RF Circuits, 2003 Symposium on VLSI Circuits Digest of Technical Papers, pp. 29-32.

* cited by examiner

*Primary Examiner* — Mark Prenty
(74) *Attorney, Agent, or Firm* — Mikio Ishimaru

(57) ABSTRACT

A method of manufacture of an integrated circuit system includes: providing a substrate including front-end-of-line circuitry; forming a first group of metal layers including a first finger and a second finger over the substrate utilizing a first design rule, the first group of metal layers being formed without a finger via; forming a second group of metal layers including a first finger, a second finger, and a finger via over the first group of metal layers utilizing a second design rule that is larger than the first design rule; and interconnecting the first group of metal layers with the second group of metal layers to form a capacitor.

25 Claims, 4 Drawing Sheets

INTEGRATED CIRCUIT SYSTEM WITH HIERARCHICAL CAPACITOR AND METHOD OF MANUFACTURE THEREOF

TECHNICAL FIELD

The present invention relates generally to an integrated circuit system, and more particularly to an integrated circuit system including a hierarchical capacitor.

BACKGROUND ART

Integrated circuits find application in many of today's consumer electronics, such as cell phones, video cameras, portable music players, printers, computers, location based devices, etc. Integrated circuits may include a combination of active devices, passive devices and their interconnections.

On-chip capacitors are critical components of integrated circuits. These capacitors are used for a variety of purposes including bypass and capacitive matching to analog and radio frequency integrated circuit applications. Recently, back-end-of-line (BEOL) vertical natural capacitors (VNCAP) with inter-digitated metal structures have emerged as an attractive option for advanced CMOS and BiCMOS RF technologies because conventional planar capacitors such as metal-insulator-metal (MIM) capacitors require extra process steps and masks. However, as technology continues to advance, VNCAP structures with increasing unit capacitance and improving quality factor are desired.

Accordingly, designers have begun to exploit the intra-metal capacitance of VNCAP structures by utilizing the smallest length width and space design rules to increase the unit capacitance of the VNCAP structure. Unfortunately, with the integration of low and ultra-low dielectric constant materials within BEOL processes (e.g., to reduce RC delay), the gain in intra-metal capacitance is reduced significantly, even when minimum design rule metal lines are fabricated.

Thus, a need still remains for a reliable integrated circuit system, method of fabrication, and device design, wherein the integrated circuit system exhibits improved VNCAP reliability performance, increased unit capacitance, decreased resistance, and/or increased quality factor. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a substrate including front-end-of-line circuitry; forming a first group of metal layers including a first finger and a second finger over the substrate utilizing a first design rule, the first group of metal layers being formed without a finger via; forming a second group of metal layers including a first finger, a second finger, and a finger via over the first group of metal layers utilizing a second design rule that is larger than the first design rule; and interconnecting the first group of metal layers with the second group of metal layers to form a capacitor.

The present invention provides an integrated circuit system, including: a substrate including front-end-of-line circuitry; a first group of metal layers including a first finger and a second finger over the substrate, the first group of metal layers configured pursuant to a first design rule and without a finger via; a second group of metal layers including a first finger, a second finger, and a finger via over the first group of metal layers, the second group of metal layers configured pursuant to a second design rule that is larger than the first design rule; and the first group of metal layers interconnected with the second group of metal layers to form a capacitor.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 3:
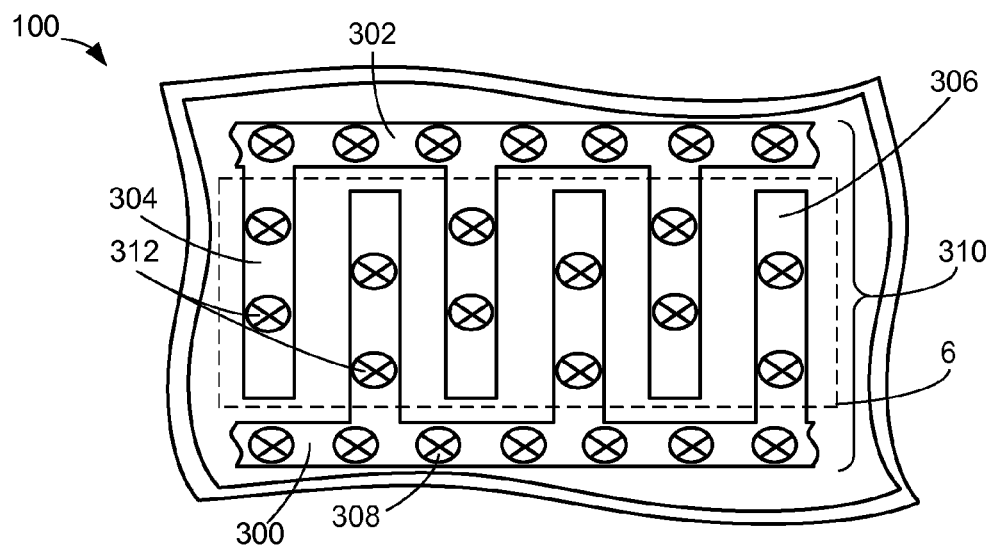
FIG. 3 is a partial top view of an integrated circuit system including a third group metallization layer in a back-end-of-line stage of manufacture in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference nomenclatures.

For expository purposes, the term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", and "third" as used herein are for purposes of differentiation between elements only and are not to be construed as limiting the scope of the present invention.

The term "pitch" is used herein to mean the edge-to-edge distance between features in a pattern. For example, "pitch" could be defined as roughly equal to: (the width of a finger) plus (the spacing between adjacent members of the finger).

The term "via density" is used herein to mean the area occupied by vias (e.g., strap vias and/or finger vias) divided by the total area of the vias and the space between the vias.

The term "strap via" is used herein to mean an electrical interconnection directly contacting vertically adjacent configurations of a first strap or a second strap as these terms are used herein.

The term "finger via" is used herein to mean an electrical interconnection directly contacting vertically adjacent configurations of a first finger or a second finger as these terms are used herein.

It is to be understood that the circles representing vias in the following drawings are merely representing centers of the vias that are generally square in shape.

The term "minimum dimension" is used herein to mean the smallest reproducible feature size permitted by the current processing technology node.

For purposes of this disclosure, the term front-end-of-line (FEOL) is used herein to mean process steps from wafer start through contact etch, including the fabrication of active and passive device structures.

For purposes of this disclosure, the term back-end-of-line (BEOL) is used herein to mean process steps from contact metal through completion of the wafer prior to electrical test, which may include the formation of BEOL metallization layers to form capacitor structure over a substrate including FEOL structures.

For purposes of this disclosure, if the first design rule is equal to the minimum reproducible dimension permitted by the current processing technology node it will be termed a 1× configuration, then the second design rule can be about two times 1× (2*1×) or a 2× configuration, and the third design rule can be greater than 2× or a >2× configuration, such as 4×. Accordingly, it will be appreciated by those skilled in the art that if a 1×DR minimum dimension is approximately equal to 50 nanometers, then a 2×DR minimum dimension can be approximately equal to 100 nanometers, and a greater than 2×DR minimum dimension can be approximately greater than 100 nanometers, e.g., about 200 nanometers for a 4×DR minimum dimension.

It should be understood that the design rules, definitions, and nomenclature used herein are given by way of example only and that one skilled in the art would readily understand that other design rules, definitions, and nomenclature may be used to illustrate the techniques, systems, devices, and methods described.

Generally, the following embodiments relate to the formation of an integrated circuit system including a back-end-of-line (BEOL) hierarchical capacitor structure formed from a mixture of metal layers, wherein some metal layers are formed without finger vias and some are formed with finger vias. Table I provides experimental data for three different six layer 65 nm VNCAP structures: 1) with no finger vias at M1× and M2×, 2) with finger vias at M1× and M2×, and 3) with no finger vias at M1× and finger vias at M2×.

TABLE I

| 65 nm VNCAP Design | (1) No finger vias at M1x No finger vias at M2x | (2) Finger vias at M1x Finger vias at M2x | (3) No finger vias at M1x Finger vias at M2x |
|---|---|---|---|
| Four M1x layers (e.g., M1-M4) | 1.8 fF/um$^2$ | 1.35 fF/um$^2$ | 1.8 fF/um$^2$ |
| Two M2x layers (e.g., M5-M6) | 0.3 fF/um$^2$ | 0.33 fF/um$^2$ | 0.38 fF/um$^2$ |
| Total Unit Capacitance | 2.1 fF/um$^2$ | 1.68 fF/um$^2$ | 2.18 fF/um$^2$ |

Table I clearly depicts how the total unit capacitance of a BEOL capacitor structure can be improved by utilizing a mixture of metal layers without vias and metal layers with vias (noting 65 nm VNCAP Design #3 above). Furthermore, the present inventors have also discovered that by utilizing a VNCAP design with a mixture of metal layers without vias and metal layers with vias, the capacitor reliability and RF performance can be improved without sacrificing the capacitance density.

As an exemplary illustration, the present embodiments can manufacture the BEOL hierarchical capacitor structure by forming a first group of metallization layers (e.g., the metallization layers formed pursuant to a 1× design rule adjacent the substrate) without finger vias, thereby permitting an increase in density and capacitance at the 1× level. The 1× level experiences an increase in density and capacitance because the 1× fingers can be formed with a 1× minimum design rule dimension that does not require relaxation to circumvent via shorting.

The metallization layers formed above the 1× level (e.g., at the 2× level and/or at the greater than (>) 2× level) can be formed with finger vias. More specifically, the groups of metal layers formed above the 1× level may include an optimized finger via density between fingers of vertically adjacent metal layers within groups of metal layers, wherein each of the vertically stacked group of metal layers utilize an increasing metal line design rule.

By optimizing the via density per group of metal layers with increasing metal line design rule by utilizing the minimum DR dimension associated with each respective group of metal layers and their vias, the total area of the vias between vertically adjacent layers can be optimized, the via resistance can be lowered, and the effective capacitor plate area of a BEOL vertical natural capacitor (VNCAP) structure can be increased, thereby improving the reliability of the VNCAP structure. Moreover, by optimizing the via density per group of metal layers with increasing metal line design rule, the present embodiments overcome VNCAP problems associated with: the use of various design rule metal lines, device reliability due to extruded and/or misaligned vias causing electrical shorts, and lower unit capacitance due to integration of low and ultra-low k dielectric constant (Lo-k) material in BEOL capacitors, by increasing the via density. Additionally, the present embodiments disclosed herein increase and/or improve the quality factor for a BEOL capacitor structure by reducing the total via resistance. It will be appreciated by those skilled in the art that the above aspects can help to improve the overall reliability performance of a VNCAP.

FIGS. 1-8, which follow, depict by way of example and not by limitation, exemplary embodiments for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit system of the present disclosure may include any number of active device structures and/or passive device structures. Exemplary illustrations of devices within the integrated circuit system may include processor components, memory components, logic components, digital components, analog components, mixed-signal components, power components, radio-frequency (RF) components (e.g., RF CMOS circuits), digital signal processor components, resistor components, inductor components, capacitor components, micro-electromechanical components, optical sensor components, and so forth, in numerous configurations and arrangements as may be needed.

Furthermore, it is to be understood that one or more of the integrated circuit system could be prepared at one time on a medium, which could be separated into individual or multiple integrated circuit package assemblies at a later stage of fabrication.

Figure 1:
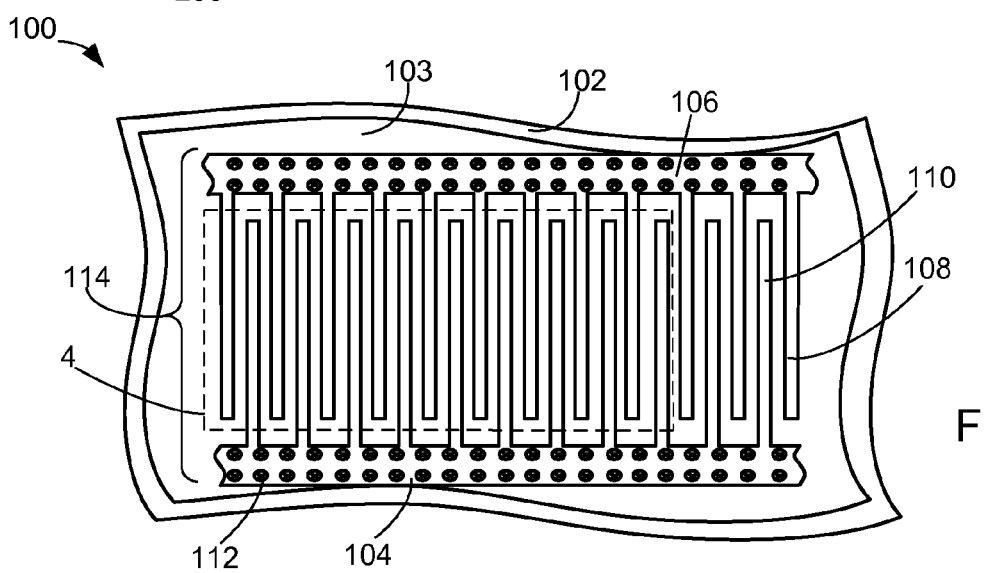
FIG. 1 is a partial top view of an integrated circuit system including a first group metallization layer in a back-end-of-line stage of manufacture in accordance with an embodiment of the present invention.

Referring now to FIG. 1, therein is shown a partial top view of an integrated circuit system 100 including a first group metallization layer 114 in a back-end-of-line stage of manufacture in accordance with an embodiment of the present invention.

Generally, the integrated circuit system 100 may include a hierarchical VNCAP structure formed above a substrate 102. By way of example, the substrate 102 can range from an individual chip diced from a wafer to a three hundred (300) mm semiconductor wafer upon which any number of active and/or passive device structures, such as front-end-of-line circuitry 103, and their interconnections could be formed.

Generally, the VNCAP structure can be formed by BEOL metal layers, such as metal layers M1-Mx where x may equal a positive integer greater than one (1). It will be appreciated by those skilled in the art that these metal layers can be grouped to include one or more vertically stacked groups of progressively larger metal layers, wherein the metal layers within each group are substantially parallel with each other and the substrate 102.

The present embodiment depicts the first group metallization layer 114 including a first strap 104, a second strap 106, a first finger 108, a second finger 110, and a strap via 112 formed above the substrate 102. It will be appreciated by those skilled in the art that a dielectric material (not shown for clarity) can be formed between the straps, fingers, and vias of the same and different metal layers. The first group metallization layer 114 may also be referred to as a metal layer.

Generally, one or more of the first group metallization layer 114 such as, a first metallization layer (M1), a second metallization layer (M2), a third metallization layer (M3), a fourth metallization layer (M4), and/or a fifth metallization layer (M5), can be vertically stacked one over the other to form a group of metal layers. However, it is to be understood that any number (e.g., one or more) of the metallization layers can be employed to obtain a VNCAP structure with a strategically designed capacitance value. Furthermore, it will be appreciated by those skilled in the art that the first group metallization layer 114 directly adjacent the substrate 102 (e.g., the first metallization layer M1) can be in electrical connection with the FEOL circuit structures (e.g., active and passive devices) formed on and/or within the substrate 102 by the strap via 112.

In at least one embodiment, the first strap 104 and the second strap 106, each of opposite polarity compared to the other, can be formed offset, parallel and opposing the other. In such cases, the first strap 104 may possess a first polarity (e.g., negative) and the second strap 106 may possess a second polarity (e.g., positive), or vice-versa. In some embodiments, the first strap 104 and the second strap 106 can be wider than the first finger 108 and the second finger 110 to accommodate a particular configuration or density of the strap via 112. However, it will be appreciated by those skilled in the art that the shape or size of the first strap 104 and the second strap 106 need only be limited by the design specifications of the VNCAP structure. Moreover, it will be appreciated by those skilled in the art that one or more of the strap via 112 can be used to electrically interconnect the first strap 104 of two adjacent layers (e.g., M1 and M2) and that one or more of the strap via 112 can be used to electrically interconnect the second strap 106 of two adjacent layers.

As an exemplary illustration, the present embodiment depicts each of the first strap 104 and the second strap 106 utilizing forty two (42) of the strap via 112 to interconnect each strap of each layer to a respective strap of an adjacent layer. However, it is to be understood that the number of the strap via 112 employed by the present embodiments is not limited by the preceding example. In at least one embodiment, the number of the strap via 112 may be more or less and may vary with the device design parameters, the need to improve unit capacitance, the need to improve quality factor, the need to reduce via resistance, and/or the need to ensure a good electrical interconnection between straps of different layers. Moreover, it is to be understood that the number of the strap via 112 used to connect the first strap 104 of two adjacent layers need not be the same as the number of the strap via 112 used to connect the second strap 106 of two adjacent layers.

In at least one embodiment, the number and/or density of the strap via 112 formed over the first strap 104 and/or the second strap 106 can be approximately equal to the maximum number or density of the strap via 112 permitted according to minimum design rules for the first group metallization layer 114. The present inventors have discovered that by increasing and/or maximizing the number and/or density of the strap via 112 that the quality factor of the VNCAP can be improved.

Projecting from the first strap 104 and the second strap 106 are the first finger 108 and the second finger 110, respectively, wherein alternating fingers are connected to the first strap 104 and the second strap 106, thereby forming an inter-digitated structure. Accordingly, the first finger 108 and the second finger 110 are separated and alternately connected to either of the first strap 104 and the second strap 106, thereby forming alternating members/fingers with first and second polarities. It will be appreciated by those skilled in the art that the number of the first finger 108 and the second finger 110 per each of the first group metallization layer 114 can vary with device design parameters (e.g., the current process technology node), the need to improve unit capacitance, and/or the need to improve quality factor.

Generally, the design of the first group metallization layer 114 may be dependent on a design rule minimum dimension (or ground rule dimension). More particularly, each of the first finger 108, the second finger 110, and the strap via 112 can be designed pursuant to a 1× minimum width, a 1× minimum spacing, and/or a 1× minimum pitch design rule, which can be determined by the design rules of the process being used. By way of example, a 1× design rule minimum dimension can be defined as the smallest reproducible feature size permitted by the current processing technology node. However, it will be appreciated by those skilled in the art that when a current processing technology node does not satisfy the design rule minimum dimension, the yield may be enhanced by using a recommended rule value that is slightly higher (e.g., relaxed design rule, such as 1.5×) than the design rule minimum dimension in the layout design of the integrated circuit system 100, at the expense of reduction in capacitance per unit area.

In at least one embodiment, the first finger 108, the second finger 110, and the strap via 112 can be formed using a one times (1×) design rule (DR) scheme. Per this disclosure, a 1×DR may also be referred to as a first design rule. Generally, the width, spacing, and/or pitch between the fingers and vias, will preferably be kept at the 1×DR minimum dimension for the first group metallization layer 114 to maximize the density and intra-layer capacitance between the fingers, while reducing the total via resistance.

It will be appreciated by those skilled in the art that if a 1×DR minimum dimension is approximately equal to 50 nanometers, then a 2×DR minimum dimension can be approximately equal to 100 nanometers, and a 4×DR minimum dimension can be approximately equal to 200 nanometers, etc. Per this disclosure, a 2×DR and a 4×DR may also be referred to as a second design rule and a third design rule, respectively. As is evident from the disclosure herein, the first design rule is different from the second design rule and the third design rule. Generally, the second design rule is larger than the first design rule and the third design rule is larger than the second design rule. In such cases, the first design rule can represent the minimum dimension that a feature can be formed at for the current processing technology node.

However, it is to be understood that the 1×DR minimum dimension width, spacing, and/or pitch for each of the first finger 108, the second finger 110, and the strap via 112, are only to be limited by the manufacturing equipment and processes of the current technology node (e.g., 45 nm process, 32 nm process or below) for forming an inter-digitated structure, such as the first group metallization layer 114.

The present inventors have discovered that the interconnecting of fingers and vias utilizing a 1×DR minimum dimension becomes increasingly complex for sub 90 nm manufacturing processes. Commonly, the vias and fingers formed at the 1×DR minimum dimension in sub 90 nm manufacturing experience extruding or misalignment that cause electrical shorts, which can detrimentally affect the reliability of the VNCAP structure. For example, since the vertically stacked interdigitated fingers of each of the first group metallization layer 114 are parallel to each other, any misalignment of the interconnecting via and/or the fingers from one layer to the next, can lead to unwanted capacitance variance and electrical shorts.

The present inventors have solved this problem by not forming any vias between adjacent layers of the first finger 108 and the second finger 110 at the first group metallization layer 114. For example, between the first metallization layer (M1) and the second metallization layer (M2), no vias are formed to interconnect vertically stacked fingers of the first finger 108 and the second finger 110. Accordingly, the present inventors have discovered a way to eliminate the electrical shorts, capacitance variances, and reliability issues due to extruding and/or misaligned vias.

Moreover, the present inventors have also discovered that by forming vertically adjacent layers of the first finger 108 and the second finger 110 without vias there between, the first group metallization layer 114 can be reliably formed pursuant to a 1×DR minimum dimension. By not forming vias between vertically adjacent layers of the first finger 108 and the second finger 110, the 1×DR minimum dimension used for the first group metallization layer 114 need not be relaxed to prevent the electrical shorts, capacitance variances, and reliability issues due to extruding and/or misaligned vias. Furthermore, by forming a VNCAP structure without vias between vertically adjacent layers of the first finger 108 and the second finger 110, the density and unit capacitance of the first group metallization layer 114 may also be increased because the 1×DR minimum dimension need not be relaxed for the first group metallization layer 114.

This discovery is notable because prior methodologies have always attempted to increase the unit capacitance within the 1× level by reducing the space between each 1× level via to increase the number of via, as exemplified by the experimental data of Table II depicted below:

TABLE II

|  | 1x level Via Spacing (nm) | | |
| --- | --- | --- | --- |
|  | 100 | 300 | 600 |
| Unit Capacitance (fF/um2) | 4.62 | 4.03 | 3.75 |

Additionally, the present inventors have also discovered that any detrimental effects (e.g., a reduction in quality factor) incurred by not forming the vias between adjacent layers of the first finger 108 and the second finger 110 can be offset or ameliorated by maximizing the number or density of the strap via 112 formed within the first strap 104 and the second strap 106. By maximizing the number or density of the strap via 112 within the first strap 104 and the second strap 106, the quality factor of the VNCAP structure can be improved by lowering the resistance of the VNCAP structure. By way of example, the number or density of the strap via 112 can be maximized by utilizing a 1×DR minimum dimension and/or by enlarging the first strap 104 and the second strap 106 to accommodate more of the strap via 112.

It will be appreciated by those skilled in the art that the first strap 104, the second strap 106, the first finger 108, the second finger 110, and the strap via 112 can be formed from a conductive material that offers a low resistance to the passage of electrical current, such as a metal or a semiconducting material. Moreover, the material composition of one finger may vary from that of another finger, the same for straps and strap vias, as well. Additionally, the material composition of fingers, straps and strap vias need not be identical.

Further, the dielectric material deposited around the hierarchical VNCAP structure may include any type of material that can sustain an electric field and act as an insulator to isolate conductors from one another. In at least one embodiment, the dielectric material may include a low-k dielectric material, e.g., a dielectric material with a dielectric constant value below about 3.9. In other embodiments, the dielectric material may include multiple different dielectric materials with varying dielectric constants to optimize the capacitance value of the VNCAP structure.

However, it is to be understood that the above examples are not limiting and the choice of conductive materials and dielectric materials are only to be limited by the device design and the manufacturing process.

Box 4 demarcates an area enlarged by FIG. 4 and described further below.

Figure 2:
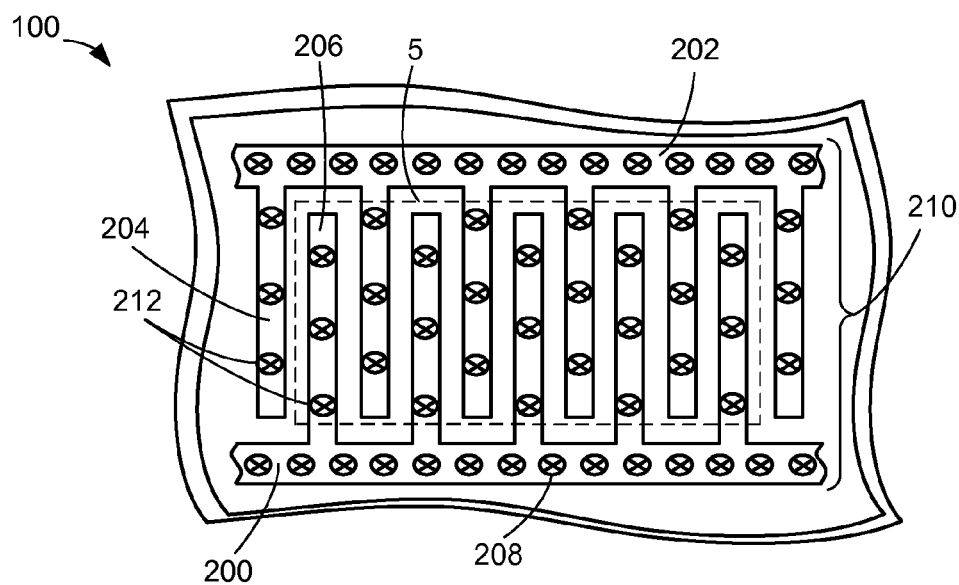
FIG. 2 is a partial top view of an integrated circuit system including a second group metallization layer in a back-end-of-line stage of manufacture in accordance with an embodiment of the present invention.

Referring now to FIG. 2, therein is shown a partial top view of the integrated circuit system 100 including a second group metallization layer 210 in a back-end-of-line stage of manufacture in accordance with an embodiment of the present invention. FIG. 2 depicts a similar configuration as to that shown in FIG. 1, and consequently, only the differences between the figures will be described to avoid redundancy.

Figure 4:
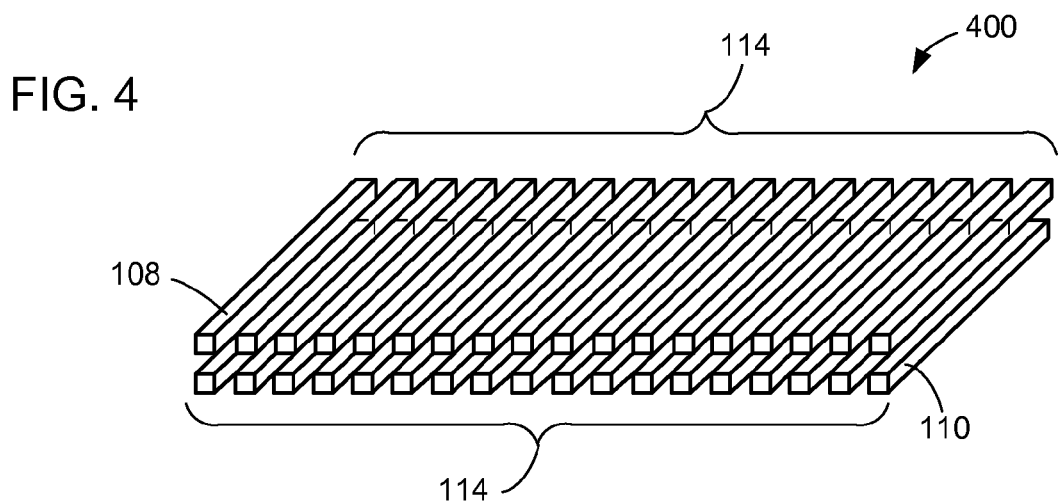
FIG. 4 is a partial three-dimensional schematic enlarged view of the region within the dashed box 4 of FIG. 1.

The present embodiment depicts the second group metallization layer 210 including a first strap 200, a second strap 202, a first finger 204, a second finger 206, and a strap via 208 formed above the first group of metal layers 400, of FIG. 4. It will be appreciated by those skilled in the art that a dielectric material (not shown) can be formed between the straps, fingers, and vias of the same and different metal layers. The second group metallization layer 210 may also be referred to as a metal layer. In one embodiment, the metal lines belonging to the second group metallization layer 210 are of twice the thickness of the metal lines belonging to the first group metallization layer 114, of FIG. 1.

Generally, one or more of the second group metallization layer 210 such as, a fifth metallization layer (M5), a sixth metallization layer (M6), and/or a seventh metallization layer (M7), can be vertically stacked to form a group of metal layers. However, it is to be understood that any number of the second group metallization layer 210 can be employed to obtain a VNCAP structure with a desired capacitance value.

Furthermore, it will be appreciated by those skilled in the art that the second group metallization layer 210 directly adjacent the first group of metal layers 400 can be in electrical contact with the top metal layer of the first group of metal layers 400 by way of the straps. By way of example, the strap via 208 can connect the uppermost of the strap via 112, of FIG. 1, to the lowermost of the strap via 208 (i.e., the strap via 208 bridges between the first group metallization layer 114, of FIG. 1, and the second group metallization layer 210). In at least one embodiment, the strap via 208 interconnected with the uppermost of the strap via 112 can be formed as part of a dual damascene structure that forms the strap via 208 and the first strap 200 and/or the strap via 208 and the second strap 202.

In some embodiments, the first strap 200 and the second strap 202 can be wider than the first finger 204 and the second finger 206 to accommodate a particular configuration or density of the strap via 208. However, it will be appreciated by those skilled in the art that the shape or dimensions of the first strap 200 and the second strap 202 need only be limited by the design specifications of the VNCAP structure. As is evident from the disclosure herein, one or more of the strap via 208 can be used to electrically interconnect the first strap 200 of two adjacent layers (e.g., M6 and M7) and that one or more of the strap via 208 can be used to electrically interconnect the second strap 202 of two adjacent layers.

As an exemplary illustration, the present embodiment depicts each of the first strap 200 and the second strap 202 utilizing fourteen (14) of the strap via 208 to interconnect each strap of each layer to a respective strap of an adjacent layer. However, it is to be understood that the number of the strap via 208 employed by the present embodiments is not limited by the preceding example. In at least one embodiment, the number of the strap via 208 may be more or less and may vary with the device design parameters, the need to improve unit capacitance, the need to improve quality factor, the need to reduce via resistance, and/or the need to ensure a good electrical interconnection between straps of different layers. Moreover, it is to be understood that the number of the strap via 208 used to connect the first strap 200 of two adjacent layers need not be the same as the number of the strap via 208 used to connect the second strap 202 of two adjacent layers.

In at least one embodiment, the number and/or density of the strap via 208 formed over the first strap 200 and/or the second strap 202 can be approximately equal to the maximum number or density of the strap via 208 permitted according to a 2× minimum dimension DR configuration. The present inventors have discovered that by increasing and/or maximizing the number and/or density of the strap via 208 for a 2×DR configuration that the quality factor of the VNCAP structure can be improved.

Although, the present embodiment depicts a certain number of the first finger 204 and the second finger 206, it will be appreciated by those skilled in the art that the present embodiment may include any number of the first finger 204 and the second finger 206 per each of the second group metallization layer 210. For example, the number of the first finger 204 and the second finger 206 can vary with device design parameters (e.g., the current process technology node), the need to improve unit capacitance, and/or the need to improve quality factor.

Generally, the first finger 204, the second finger 206, and the strap via 208 will preferably possess a minimum width, a minimum spacing, and a minimum pitch, which can be determined by the design rules of the process being used (e.g., a second design rule). For example, in at least one embodiment, the first finger 204, the second finger 206, and the strap via 208 can be formed using a 2×DR configuration. Generally, the width, spacing, and/or pitch between the fingers and vias of a 2×DR configuration will preferably be kept at a 2×DR minimum dimension to maximize the density and intra-layer capacitance between the fingers, as well as to reduce the total via resistance, for the second group metallization layer 210.

However, it is to be understood that the 2×DR minimum dimension width, spacing, and/or pitch for each of the first finger 204, the second finger 206, and the strap via 208, are only to be limited by the manufacturing equipment and processes of the current technology node (e.g., 45 nm process, 32 nm process or below) for forming an inter-digitated structure, such as the second group metallization layer 210. Furthermore, it is to be understood that the first finger 204, the second finger 206, and the strap via 208 may separately or collectively be formed with a width or space dimension that exceeds the 2×DR minimum dimension (e.g., a loosened DR configuration) if design requirements require (e.g., to improve the quality factor or the reliability of the VNCAP structure).

As will be evident to those skilled in the art, a loosened or relaxed design tolerance that permits the first finger 204, the second finger 206, and the strap via 208 to be formed with a width or space dimension that exceeds a 2×DR minimum dimension, permits an easing of the process latitude for the system, thereby enabling more products to pass electrical tests and device reliability requirements.

Notably, by forming the second group metallization layer 210 with a 2×DR, the problems associated with via extrusion or misalignment that occurs at the 1×DR level can be minimized. Accordingly, the present inventors discovered that one or more of a finger via 212 can be formed between vertically adjacent layers of the first finger 204 and the second finger 206 with reduced occurrences of via extrusion and/or misalignment.

Generally, each of the finger via 212 of the present embodiments can be formed in relation to the other such that their configuration helps to increase unit capacitance, reduce the resistance and increase the quality factor of the VNCAP structure. In at least one embodiment, each of the finger via 212 can be formed with a width and spacing that is approximately equal to a 2×DR minimum dimension. It will be appreciated by those skilled in the art that a 2×DR minimum dimension configuration for the finger via 212 can maximize the density and capacitance of the second group metallization layer 210. Moreover, it is to be understood that the width, spacing, and/or pitch for each of the finger via 212, are only to be limited by the manufacturing equipment and processes of the current technology node (e.g., 45 nm process, 32 nm process or below) for forming a vertically interconnected inter-digitated structure.

Additionally, it is to be understood that the finger via 212 may separately or collectively be formed with a width or space dimension that exceeds the 2×DR minimum dimension (e.g., a loosened DR configuration employing sparingly spaced via) if design requirements require (e.g., to improve the quality factor or the reliability of the VNCAP structure). A sparingly spaced configuration of the finger via 212 can be used to help prevent electrical shorts between adjacent ones of the finger via 212.

In some embodiments, each of the finger via 212 formed over the first finger 204 and the second finger 206 can be staggered such that no two adjacent ones of the finger via 212 overlap when viewed as a cross section. By forming each of the finger via 212 over the first finger 204 so as to not overlap the length of an adjacent one of the finger via 212 formed over the second finger 206, the risk of short circuits caused by misalignment of the finger via 212 can be greatly reduced, while capacitance can be increased. Stated another way, if the finger via 212 formed over the first finger 204 are spaced apart from each other by a vector quantity X, then the finger via 212 formed over the second finger 206 are also spaced apart from each other by the vector quantity X but are offset from the finger via 212 formed over the first finger 204 by about (½) the vector quantity X.

Furthermore, it will be appreciated by those skilled in the art that the present embodiments may also utilize design rule technologies that include via enclosure rules to ensure that both the landing metal and the covering metal enclose the via by a certain amount. In other words, these via enclosure rules ensure that each metal layer overlaps a via with a certain amount of extra metal to ensure that the via provides a good connection between the two metal layers once fabricated.

Box 5 demarcates an area enlarged by FIG. 5 and described further below.

Referring now to FIG. 3, therein is shown a partial top view of the integrated circuit system 100 including a third group metallization layer 310 in a back-end-of-line stage of manufacture in accordance with an embodiment of the present invention. FIG. 3 depicts a similar configuration as to that shown in FIGS. 1 and 2, and consequently, only the differences between the figures will be described to avoid redundancy. The integrated circuit system 100 can be formed with or without the third group metallization layer 310.

Figure 5:
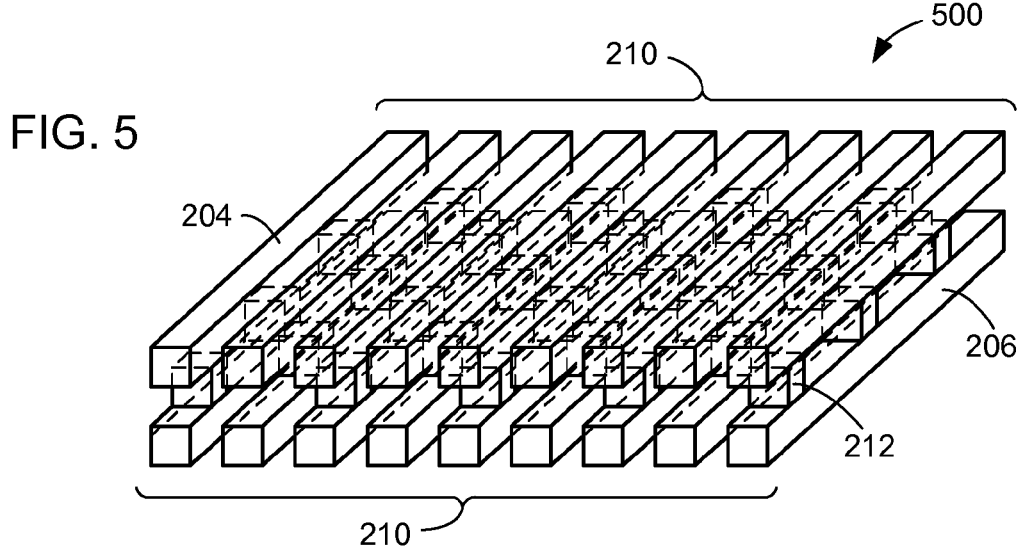
FIG. 5 is a partial three-dimensional schematic enlarged view of the region within the dashed box 5 of FIG. 2.

The present embodiment depicts the third group metallization layer 310 including a first strap 300, a second strap 302, a first finger 304, a second finger 306, and a strap via 308 formed above a second group of metal layers 500, of FIG. 5. It will be appreciated by those skilled in the art that a dielectric material (not shown) can be formed between the straps, fingers, and vias of the same and different metal layers. The third group metallization layer 310 may also be referred to as a metal layer.

Generally, one or more of the third group metallization layer 310 such as, a seventh metallization layer (M7), an eighth metallization layer (M8), and/or a ninth metallization layer (M9), can be vertically stacked to form a group of metal layers. However, it is to be understood that any number of the third group metallization layer 310 can be employed to obtain a VNCAP structure with a desired capacitance value.

Furthermore, it will be appreciated by those skilled in the art that the third group metallization layer 310 directly adjacent the second group of metal layers 500 can be in electrical contact with the top metal layer of the second group of metal layers 500 by way of the straps. By way of example, the strap via 308 can connect the uppermost of the strap via 208, of FIG. 2, to the lowermost of the strap via 308 (i.e., the strap via 308 bridges between the second group metallization layer 210, of FIG. 2, and the third group metallization layer 310). In at least one embodiment, the strap via 308 interconnected with the uppermost of the strap via 208 can be formed as part of a dual damascene structure that forms the strap via 308 and the first strap 300 and/or the strap via 308 and the second strap 302.

In some embodiments, the first strap 300 and the second strap 302 can be wider than the first finger 304 and the second finger 306 to accommodate a particular configuration or density of the strap via 308. However, it will be appreciated by those skilled in the art that the shape or dimensions of the first strap 300 and the second strap 302 need only be limited by the design specifications of the VNCAP structure. As is evident from the disclosure herein, one or more of the strap via 308 can be used to electrically interconnect the first strap 300 of two adjacent layers (e.g., M8 and M9) and that one or more of the strap via 308 can be used to electrically interconnect the second strap 302 of two adjacent layers.

As an exemplary illustration, the present embodiment depicts each of the first strap 300 and the second strap 302 utilizing seven (7) of the strap via 308 to interconnect each strap of each layer to a respective strap of an adjacent layer. However, it is to be understood that the number of the strap via 308 employed by the present embodiments is not limited by the preceding example. In at least one embodiment, the number of the strap via 308 may include one or more and may vary with the device design parameters, the need to improve unit capacitance, the need to improve quality factor, the need to reduce via resistance, and/or the need to ensure a good electrical interconnection between straps of different layers. Moreover, it is to be understood that the number of the strap via 308 used to connect the first strap 300 of two adjacent layers need not be the same as the number of the strap via 308 used to connect the second strap 302 of two adjacent layers.

In at least one embodiment, the number and/or density of the strap via 308 formed over the first strap 300 and/or the second strap 302 can be approximately equal to the maximum number or density of the strap via 308 permitted according to a greater than (>) 2× minimum dimension DR configuration (>2×DR). The present inventors have discovered that by increasing the number and/or density of the strap via 308 for a greater than (>) 2×DR configuration that the quality factor of the VNCAP can be improved. Per this disclosure, a greater than (>) 2×DR (>2×DR) may also be referred to as a third design rule.

Although, the present embodiment depicts a certain number of the first finger 304 and the second finger 306, it will be appreciated by those skilled in the art that the present embodiment may include any number of the first finger 304 and the second finger 306 per each of the third group metallization layer 310. For example, the number of the first finger 304 and the second finger 306 can vary with device design parameters (e.g., the current process technology node), the need to improve unit capacitance, and/or the need to improve quality factor.

Generally, the first finger 304, the second finger 306, and the strap via 308 will preferably possess a minimum width, a minimum spacing, and a minimum pitch, which can be determined by the design rules of the process being used (e.g., a third design rule). For example, in at least one embodiment, the first finger 304, the second finger 306, and the strap via 308 can be formed using a greater than (>) two times design rule (>2×DR) minimum dimension. Generally, the width, spacing, and/or pitch between the fingers and vias of a greater than (>) 2×DR configuration will preferably be kept at a >2×DR minimum dimension to maximize the density and intra-layer capacitance between the fingers, as well as to reduce the total via resistance, for the third group metallization layer 310.

However, it is to be understood that the greater than (>) 2×DR minimum dimension width, spacing, and/or pitch for each of the first finger 304, the second finger 306, and the strap via 308, are only to be limited by the manufacturing equipment and processes of the current technology node (e.g., 45 nm process, 32 nm process or below) for forming an inter-digitated structure, such as the third group metallization layer 310. Furthermore, it is to be understood that the first finger 304, the second finger 306, and the strap via 308 may separately or collectively be formed with a width or space dimension that exceeds the greater than (>) 2×DR minimum dimension (e.g., a loosened DR configuration) if design requirements require (e.g., to improve the quality factor or the reliability of the VNCAP structure).

As will be evident to those skilled in the art, a loosened or relaxed design tolerance that permits the first finger 304, the second finger 306, and the strap via 308 to be formed with a width or space dimension that exceeds the greater than (>) 2× minimum DR, permits an easing of the process latitude for the system, thereby enabling more products to pass electrical tests and device reliability requirements.

Notably, by forming the third group metallization layer 310 with a greater than (>) 2×DR configuration, the problems associated with via extrusion or misalignment that occurs at the 1×DR level can be minimized. Accordingly, the present inventors discovered that one or more of a finger via 312 can be formed between vertically adjacent layers of the first finger 304 and the second finger 306 with reduced occurrences of via extrusion and/or misalignment.

Generally, each of the finger via 312 can be formed in relation to the other such that their configuration helps to increase unit capacitance, reduce the resistance and increase the quality factor of the VNCAP structure. In at least one embodiment, the finger via 312 can be formed with a width and/or spacing that is approximately equal to a greater than (>) 2×DR minimum dimension. It will be appreciated by those skilled in the art that such a configuration can maximize the density and capacitance of the third group metallization layer 310. Moreover, it is to be understood that the width, spacing, and/or pitch for each of the finger via 312, are only to be limited by the manufacturing equipment and processes for the current technology node (e.g., 45 nm process, 32 nm process or below) for forming a vertically interconnected inter-digitated structure.

However, it is to be understood that the finger via 312 may separately or collectively be formed with a width and/or space dimension that exceeds the greater than (>) 2×DR (>2×DR) minimum dimension (e.g., a loosened DR configuration) if design requirements require (e.g., to improve the quality factor or the reliability of the VNCAP structure).

In some embodiments, each of the finger via 312 formed over the first finger 304 and the second finger 306 can be staggered such that no two adjacent ones of the finger via 312 overlap when viewed as a cross section. By forming each of the finger via 312 over the first finger 304 so as to not overlap the length of an adjacent one of the finger via 312 formed over the second finger 306, the risk of short circuits caused by misalignment of the finger via 312 can be greatly reduced, while capacitance can be increased. Stated another way, if the finger via 312 formed over the first finger 304 are spaced apart from each other by a vector quantity X, then the finger via 312 formed over the second finger 306 are also spaced apart from each other by the vector quantity X but are offset from the finger via 312 formed over the first finger 304 by about (½) the vector quantity X.

Further, it will be appreciated by those skilled in the art that the total capacitance of the embodiments presented herein (e.g., a VNCAP structure including metallization layers without finger vias and metallization layers with finger vias) can exceed the capacitance of those structures of prior methodologies that either only use finger vias at every level of the VNCAP structure or do not use any finger vias at any level of the VNCAP structure.

Furthermore, it will be appreciated by those skilled in the art that the present embodiments may also utilize design rule technologies that include via enclosure rules to ensure that both the landing metal and the covering metal enclose the via by a certain amount. In other words, these via enclosure rules ensure that each metal layer overlaps a via with a certain amount of extra metal to ensure that the via provides a good connection between the two metal layers once fabricated.

Box 6 demarcates an area enlarged by FIG. 6 and described further below.

Referring now to FIG. 4, therein is shown a partial three-dimensional schematic enlarged view of the region within the dashed box 4 of FIG. 1.

Per this view, it can be seen that more than one of the first group metallization layer 114 can be vertically stacked to form the first group of metal layers 400. Although the first group of metal layers 400 is depicted as only including two of the first group metallization layer 114, it is to be understood that the first group of metal layers 400 may include any number of the first group metallization layer 114 to obtain a VNCAP structure with a desired capacitance value. For example, the first group of metal layers 400 may include one or more vertically stacked metal layers such as, a first metallization layer (M1), a second metallization layer (M2), a third metallization layer (M3), a fourth metallization layer (M4), and/or a fifth metallization layer (M5), which can be collectively referred to as the first group of metal layers 400.

Notably, this view clearly illustrates that a finger via is not formed between the first finger 108 and/or the second finger 110 of vertically stacked adjacent metal layers. By not forming the finger via between the first finger 108 and/or the second finger 110 of vertically stacked adjacent metal layers, electrical shorts due to misaligned and/or extruded vias can be eliminated, thereby improving the reliability of the VNCAP structure, while increasing the density and capacitance of the first group of metal layers 400.

It will be appreciated by those skilled in the art that the first group of metal layers 400 can utilize the potential difference between the first finger 108 and the second finger 110 within the same intra-level metal layer to create a capacitance.

Referring now to FIG. 5, therein is shown a partial three-dimensional schematic enlarged view of the region within the dashed box 5 of FIG. 2.

Per this view, it can be seen that more than one of the second group metallization layer 210 can be vertically stacked to form the second group of metal layers 500. Although the second group of metal layers 500 is depicted as only including two of the second group metallization layer 210, it is to be understood that the second group of metal layers 500 may include any number of the second group metallization layer 210 to obtain a VNCAP structure with a desired capacitance value. For example, the second group of metal layers 500 may include one or more vertically stacked metal layers such as, a fifth metallization layer (M5), a sixth metallization layer (M6), and/or a seventh metallization layer (M7), which can be collectively referred to as the second group of metal layers 500.

Notably, this view clearly illustrates the finger via 212 formed between the first finger 204 and/or the second finger 206 of vertically stacked adjacent metal layers. By forming the finger via 212 between the first finger 204 and/or the second finger 206 of vertically stacked adjacent metal layers, the finger via 212 can help to increase unit capacitance, reduce the resistance, and increase the quality factor of the VNCAP structure.

It is to be understood that the second group of metal layers 500 can utilize the potential difference between the first finger 204 and the second finger 206 within intra-level and inter-level metal layers to create a desired capacitance. It will be appreciated by those skilled in the art that the finger via 212 may also contribute to the parasitic capacitance of the system, thereby increasing the overall capacitance of the system.

Figure 6:
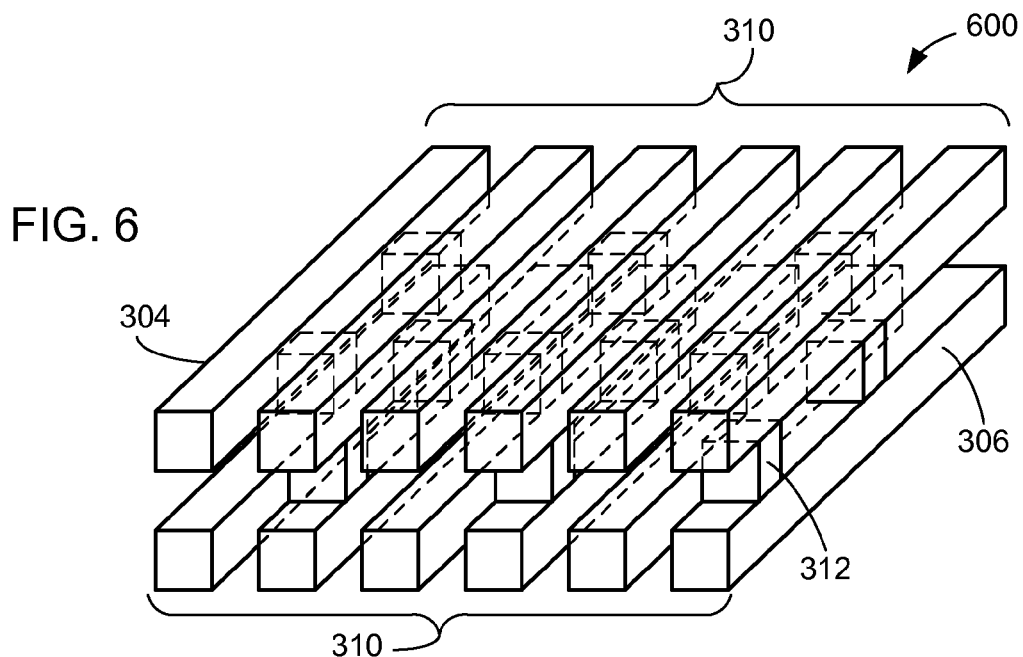
FIG. 6 is a partial three-dimensional schematic enlarged view of the region within the dashed box 6 of FIG. 3.

Referring now to FIG. 6, therein is shown a partial three-dimensional schematic enlarged view of the region within the dashed box 6 of FIG. 3.

Per this view, it can be seen that more than one of the third group metallization layer 310 can be vertically stacked to form a third group of metal layers 600. Although the third group of metal layers 600 is depicted as only including two of the third group metallization layer 310, it is to be understood that the third group of metal layers 600 may include any number (e.g., one or more) of the third group metallization layer 310 to obtain a VNCAP structure with a desired capacitance value. For example, the third group of metal layers 600 may include one or more vertically stacked metal layers such as, a seventh metallization layer (M7), an eighth metallization layer (M8), and/or a ninth metallization layer (M9), which can be collectively referred to as the third group of metal layers 600.

It will be further appreciated by those skilled in the art that the integrated circuit system 100, of FIGS. 1-3, may also include additional groups of metal layers, such as a fourth group of metal layers, a fifth group of metal layers, etc., formed over the third group of metal layers 600, as required by the design requirements of the integrated circuit system 100.

Notably, this view clearly illustrates the finger via 312 formed between the first finger 304 and/or the second finger 306 of vertically stacked adjacent metal layers. By forming the finger via 312 between the first finger 304 and/or the second finger 306 of vertically stacked adjacent metal layers, this configuration can help to increase unit capacitance, reduce the resistance and increase the quality factor of the VNCAP structure.

Accordingly, the third group of metal layers 600 utilizes the potential difference between the first finger 304 and the second finger 306 within intra-level and inter-level metal layers to create a capacitance. It will be appreciated by those skilled in the art that the finger via 312 may also contribute to the parasitic capacitance of the system, thereby increasing the overall capacitance of the system.

Figure 7:
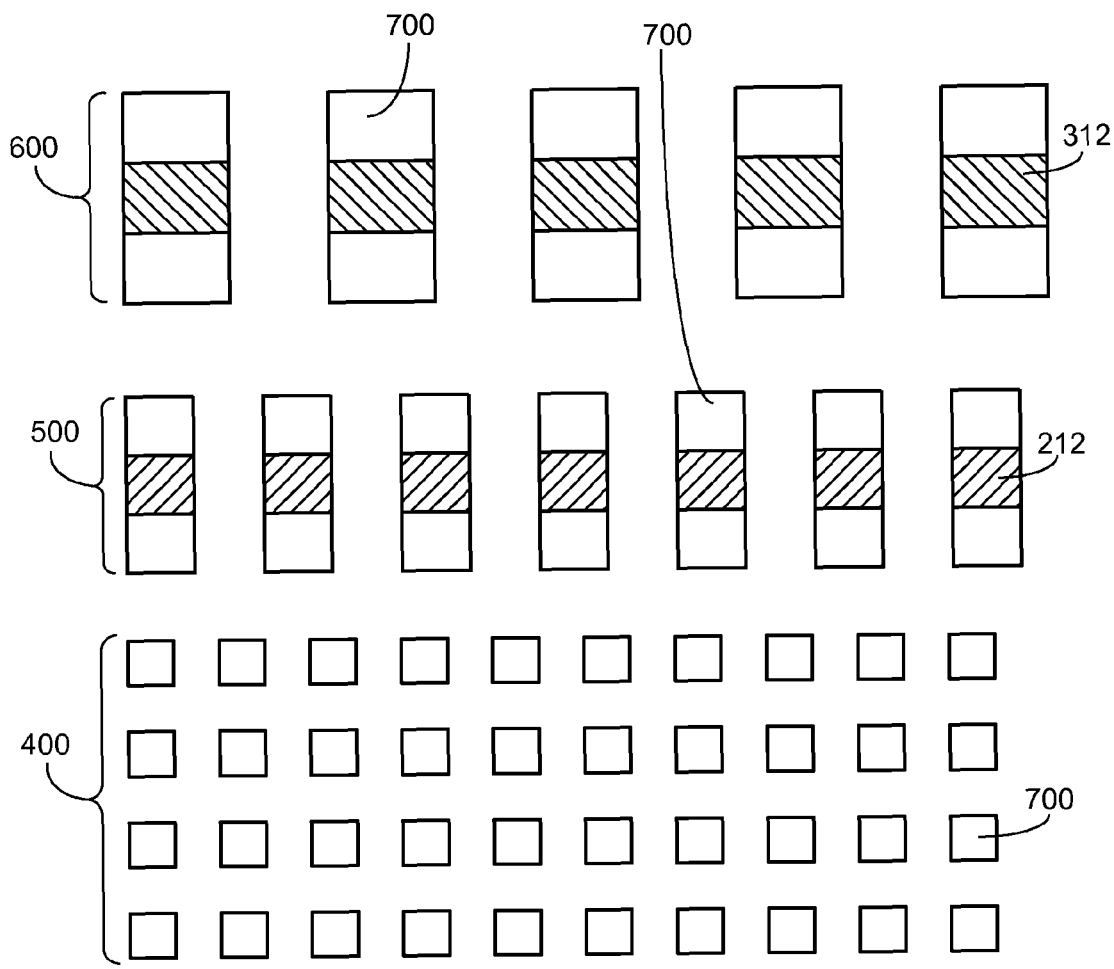
FIG. 7 is a partial cross-sectional exemplary schematic view of fingers and finger vias within an integrated circuit system in accordance with an embodiment to the present invention.

Referring now to FIG. 7, therein is shown a partial cross-sectional exemplary schematic view of fingers 700 and finger vias within the integrated circuit system 100 in accordance with an embodiment of the present invention. It is to be understood that the dielectric between the fingers 700 has been removed for clarity of illustration. The exemplary schematic illustrates how the first group of metal layers 400 can be formed without finger vias between the fingers 700, the second group of metal layers 500 can be formed with the finger via 212 between the fingers 700, and the third group of metal layers 600 can be formed with the finger via 312 between the fingers 700. Per this embodiment, the fingers 700 within each of the first group of metal layers 400, the second group of metal layers 500, and the third group of metal layers 600 may utilize a varying thickness and/or width.

In at least one embodiment, it is to be understood that the layer to layer and level to level spacing can be formed utilizing a ratio consistent with the respective design rules.

Figure 8:
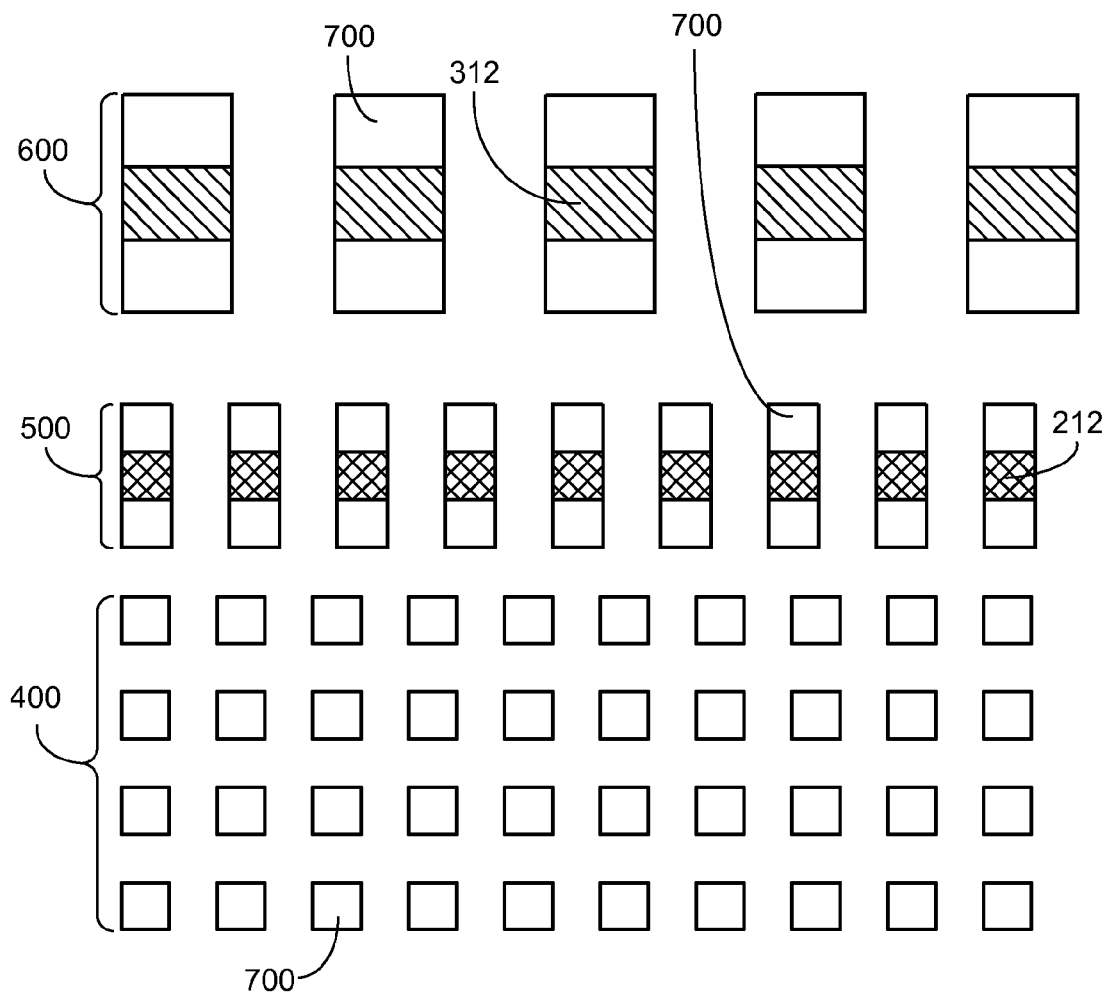
FIG. 8 is a partial cross-sectional exemplary schematic view of fingers and finger vias within an integrated circuit system in accordance with another embodiment to the present invention.

Referring now to FIG. 8, therein is shown a partial cross-sectional exemplary schematic view of the fingers 700 and finger vias within the integrated circuit system 100 in accordance with another embodiment of the present invention. It is to be understood that the dielectric between the fingers 700 has been removed for clarity of illustration. The exemplary schematic illustrates how the first group of metal layers 400 can be formed without finger vias between the fingers 700, the second group of metal layers 500 can be formed with the finger via 212 between the fingers 700, and the third group of metal layers 600 can be formed with the finger via 312 between the fingers 700. Per this embodiment, the fingers 700 within two or more groups of metal layers may possess substantially the same thickness and/or width, while the remaining groups of metal layers may possess a different thickness and/or width.

For example, in at least one embodiment, the first group of metal layers 400 and the second group of metal layers 500 may utilize a thickness and/or width for the fingers 700 that is substantially the same for each metallization level (e.g., a 1× design rule thickness and/or width), while the third group of metal layers 600 may utilize a 4× design rule. It will be appreciated by those skilled in the art that the finger via 212 can be formed utilizing a 1× design rule width and/or spacing configuration, although larger width and/or spacing configurations can be used as well. As is evident from the disclosure, the finger via 212 may include a staggered configuration.

It is to be understood that in order to accommodate the finger via 212 within the second group of metal layers 500, the fingers 700 in the second group of metal layers 500 can be spaced at a wider pitch than the first group of metal layers 400. In such cases, the fingers 700 of the second group of metal layers 500 can be formed utilizing a relaxed pitch, e.g., with a spacing and/or pitch that is about 20% to 30% wider than the spacing and/or pitch of the first group of metal layers 400, to accommodate the added finger vias within the second group of metal layers 500, thereby preventing extruded and/or misaligned finger vias that may cause electrical shorts. As is evident from the disclosure herein, the VNCAP configuration of the present embodiment will also demonstrate improved capacitance density, improved reliability, and improved RF performance when compared to that of a conventional VNCAP structure.

It will be appreciated by those skilled in the art that the present embodiment permits one or more 1× design rule metallization levels (e.g., the first group of metal layers 400 and the second group of metal layers 500) to be formed adjacent a 4× design rule metallization level (e.g., the third group of metal layers 600).

In at least one embodiment, it is to be understood that the layer to layer and level to level spacing can be formed utilizing a ratio consistent with the respective design rules.

Figure 9:
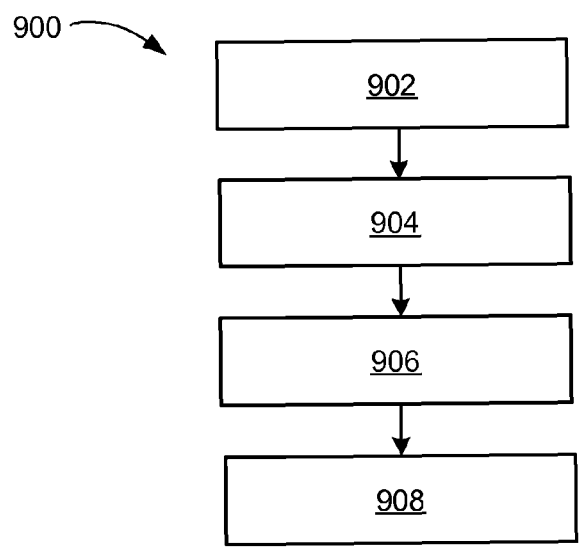
FIG. 9 is a flow chart of a method of manufacture of an integrated circuit system in an embodiment of the present invention.

Referring now to FIG. 9, therein is shown a flow chart of a method 900 of manufacture of the integrated circuit system 100 in an embodiment of the present invention. The method 900 includes: providing a substrate including front-end-of-line circuitry in a block 902; forming a first group of metal layers including a first finger and a second finger over the substrate utilizing a first design rule, the first group of metal layers being formed without a finger via in a block 904; forming a second group of metal layers including a first finger, a second finger, and a finger via over the first group of metal layers utilizing a second design rule that is larger than the first design rule in a block 906; and interconnecting the first group of metal layers with the second group of metal layers to form a capacitor in a block 908.

Thus, it has been discovered that the integrated circuit system and device or product of the present invention furnishes important and heretofore unknown and unavailable solutions, capabilities, and functional aspects for increasing unit capacitance and the quality factor of a VNCAP structure, while reducing the resistance of the VNCAP structure.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the present invention minimizes reliability issues due to extruded or misaligned vias by not forming any vias between adjacent layers of fingers within the 1×DR metallization layer of a hierarchical VNCAP structure.

Another aspect is that the present invention helps to increase unit capacitance, reduce resistance, and increase the quality factor of a hierarchical VNCAP structure by forming staggered finger vias pursuant to a minimum design rule within a 2×DR metallization layer.

Another aspect is that the present invention helps to increase unit capacitance, reduce resistance, and increase the quality factor of a hierarchical VNCAP structure by forming staggered finger vias pursuant to a minimum design rule for a greater than (>) 2×DR metallization layer.

Another aspect is that the present invention helps to improve the quality factor of a hierarchical VNCAP structure by forming strap vias pursuant to the minimum design rule for that metallization layer (e.g., a 1×DR minimum dimension, a 2×DR minimum dimension, etc.), thereby lowering the total via resistance.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit system comprising:

providing a substrate including front-end-of-line circuitry;

forming a first group of metal layers including a first finger and a second finger over the substrate utilizing a first design rule, the first group of metal layers being formed without a finger via;

forming a second group of metal layers including a first finger, a second finger, and a finger via over the first group of metal layers utilizing a second design rule that is larger than the first design rule; and interconnecting the first group of metal layers with the second group of metal layers to form a capacitor.

2. The method as claimed in claim 1 wherein:

forming the finger via includes a staggered configuration.

3. The method as claimed in claim 1 wherein:

forming the first group of metal layers utilizing the first design rule includes forming the smallest reproducible feature size permitted by the current processing technology node.

4. The method as claimed in claim 1 wherein:

interconnecting the first group of metal layers with the second group of metal layers includes a strap via from the second group of metal layers.

5. The method as claimed in claim 1 further comprising:

depositing a dielectric material with a dielectric constant value below about 3.9 around the first group of metal layers and the second group of metal layers.

6. A method of manufacture of an integrated circuit system comprising:

providing a substrate including front-end-of-line circuitry;

forming a first group of metal layers including a first finger and a second finger over the substrate utilizing a first design rule, the first group of metal layers being formed without a finger via;

forming a second group of metal layers including a first finger, a second finger, and a finger via over the first group of metal layers utilizing a second design rule that is larger than the first design rule;

forming a third group of metal layers including a first finger, a second finger, and a finger via over the second group of metal layers utilizing a third design rule that is larger than the second design rule; and interconnecting the first group of metal layers, the second group of metal layers, and the third group of metal layers to form a capacitor.

7. The method as claimed in claim 6 wherein:
forming the first group of metal layers includes forming one or more of a first group metallization layer.

8. The method as claimed in claim 6 wherein:
forming the second group of metal layers includes forming one or more of a second group metallization layer.

9. The method as claimed in claim 6 wherein:
forming the third group of metal layers includes forming one or more of a third group metallization layer.

10. The method as claimed in claim 6 wherein:
forming the third group of metal layers with the finger via includes forming the finger via with a width or spacing that is approximately equal to the third design rule minimum dimension.

11. An integrated circuit system comprising:
a substrate including front-end-of-line circuitry;
a first group of metal layers including a first finger and a second finger over the substrate, the first group of metal layers configured pursuant to a first design rule and without a finger via;
a second group of metal layers including a first finger, a second finger, and a finger via over the first group of metal layers, the second group of metal layers configured pursuant to a second design rule that is larger than the first design rule; and
the first group of metal layers interconnected with the second group of metal layers to form a capacitor.

12. The system as claimed in claim 11 wherein:
the finger via includes a staggered configuration.

13. The system as claimed in claim 11 wherein:
the first group of metal layers include the smallest reproducible feature size permitted by the current processing technology node.

14. The system as claimed in claim 11 wherein:
the first group of metal layers interconnected with the second group of metal layers includes a strap via from the second group of metal layers.

15. The system as claimed in claim 11 further comprising:
a dielectric material with a dielectric constant value below about 3.9 around the first group of metal layers and the second group of metal layers.

16. The system as claimed in claim 11 further comprising:
a third group of metal layers including a first finger, a second finger, and a finger via over the second group of metal layers utilizing a third design rule that is larger than the second design rule.

17. The system as claimed in claim 16 wherein:
the first group of metal layers includes one or more of a first group metallization layer.

18. The system as claimed in claim 16 wherein:
the second group of metal layers includes one or more of a second group metallization layer.

19. The system as claimed in claim 16 wherein:
the third group of metal layers includes one or more of a third group metallization layer.

20. The system as claimed in claim 16 wherein:
the finger via of the third group of metal layers are separated with a width or spacing that is approximately equal to the third design rule minimum dimension.

21. A method of manufacture of an integrated circuit system comprising:
providing a substrate including front-end-of-line circuitry;
forming a first group of metal layers including a first finger and a second finger over the substrate utilizing a first design rule, the first group of metal layers being formed without a finger via;
forming a second group of metal layers including a first finger, a second finger, and a finger via over the first group of metal layers utilizing the first design rule with relaxed spacing between the first finger and the second finger;
forming a third group of metal layers including a first finger, a second finger, and a finger via over the second group of metal layers utilizing a second design rule that is larger than the first design rule; and
interconnecting the first group of metal layers, the second group of metal layers and the third group of metal layers to form a capacitor.

22. The method as claimed in claim 21 wherein:
forming the finger via includes a staggered configuration.

23. The method as claimed in claim 21 wherein:
forming the first group of metal layers utilizing the first design rule includes forming the smallest reproducible feature size permitted by the current processing technology node.

24. The method as claimed in claim 21 wherein:
interconnecting the first group of metal layers, the second group of metal layers and the third group of metal layers includes utilizing a strap via.

25. The method as claimed in claim 21 further comprising:
depositing a dielectric material with a dielectric constant value below about 3.9 around the first group of metal layers, the second group of metal layers and the third group of metal layers.

* * * * *